US012343836B2

(12) United States Patent
Takemura

(10) Patent No.: US 12,343,836 B2
(45) Date of Patent: Jul. 1, 2025

(54) TREATMENT METHOD OF WORKPIECE

(71) Applicant: DISCO CORPORATION, Tokyo (JP)

(72) Inventor: Yuta Takemura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 384 days.

(21) Appl. No.: 18/181,117

(22) Filed: Mar. 9, 2023

(65) Prior Publication Data

US 2023/0294230 A1 Sep. 21, 2023

(30) Foreign Application Priority Data

Mar. 16, 2022 (JP) .................................. 2022-041808

(51) Int. Cl.
*B23Q 17/24* (2006.01)
*B23Q 17/00* (2006.01)

(52) U.S. Cl.
CPC ....... *B23Q 17/003* (2013.01); *B23Q 17/2404* (2013.01); *B23Q 2717/00* (2013.01)

(58) Field of Classification Search
CPC .......................... B23Q 17/003; B23Q 17/2404
USPC .......................................................... 33/520
See application file for complete search history.

(56) References Cited

U.S. PATENT DOCUMENTS

| | | | | |
|---|---|---|---|---|
| 3,174,392 A | * | 3/1965 | Rantsch | ................. G01B 11/00 33/791 |
| 4,457,664 A | * | 7/1984 | Judell | ..................... H01L 21/68 414/757 |
| 4,821,425 A | * | 4/1989 | Currie | ...................... G01B 7/12 33/555.1 |
| 4,833,790 A | * | 5/1989 | Spencer | ................... G01B 7/31 33/549 |
| 5,085,558 A | * | 2/1992 | Engelbrecht | .......... H01L 21/682 414/811 |

(Continued)

FOREIGN PATENT DOCUMENTS

| | | |
|---|---|---|
| DE | 102022202638 A1 | 9/2022 |
| JP | 2017038014 A | 2/2017 |

OTHER PUBLICATIONS

Office Action issued in counterpart Singapore patent application No. 10202300584X, dated Mar. 3, 2025.

(Continued)

*Primary Examiner* — George B Bennett
(74) *Attorney, Agent, or Firm* — Greer Burns & Crain Ltd.

(57) ABSTRACT

A treatment method of a workpiece includes a positional relation storing step of storing a positional relation between a reference point of the workpiece and an identification mark to identify the workpiece, holding the workpiece over a holding table, imaging the workpiece by an imaging unit and detecting the reference point. The treatment method includes also a reading step of detecting the identification mark on the basis of the positional relation recorded in the positional relation storing step and imaging the identification mark by the imaging unit to read the identification mark, a treatment step of treating the workpiece, and an information recording step of associating information regarding the workpiece indicated by the identification mark read in the reading step with treatment information relating to the treatment step and recording the information regarding the workpiece and the treatment information.

2 Claims, 8 Drawing Sheets

(56) References Cited

U.S. PATENT DOCUMENTS

| | | | |
|---|---|---|---|
| 5,452,521 A * | 9/1995 | Niewmierzycki | G01B 11/272 |
| | | | 414/936 |
| 6,198,976 B1 * | 3/2001 | Sundar | H01L 21/681 |
| | | | 700/121 |
| 6,895,831 B2 * | 5/2005 | Hunter | H01L 21/67167 |
| | | | 414/148 |
| 6,934,661 B2 * | 8/2005 | Yuen | H01L 21/67259 |
| | | | 414/935 |
| 7,089,677 B2 * | 8/2006 | Lu | H01L 21/68 |
| | | | 33/645 |
| 9,849,555 B2 * | 12/2017 | Meissner | B23Q 17/2233 |
| 10,658,214 B2 * | 5/2020 | Wang | G03F 7/2028 |
| 12,128,515 B2 * | 10/2024 | Struckmeier | B23Q 17/003 |
| 12,259,710 B2 * | 3/2025 | Takahashi | B23D 79/06 |
| 12,283,503 B2 * | 4/2025 | Ummethala | H01L 21/67259 |
| 2016/0211218 A1 | 7/2016 | Hara et al. | |

OTHER PUBLICATIONS

Office Action issued in counterpart German patent application No. 10 2023 202 063.7, dated Jul. 29, 2024.

* cited by examiner

TREATMENT METHOD OF WORKPIECE

BACKGROUND OF THE INVENTION

Field of the Invention

The present invention relates to a treatment method of a workpiece in which identification information to identify the workpiece is recorded and managed.

Description of the Related Art

In recent years, for production management, it has been required to allow tracking for each workpiece regarding what kind of treatment has been executed for the workpiece by which apparatus. In general, information regarding the workpiece and the history of the executed treatment are associated with each other and are recorded and managed by printing an identification mark such as an identification (ID), a barcode, or a character string on the workpiece and reading the identification mark before and after the treatment of the workpiece (for example, refer to Japanese Patent Laid-open No. 2017-038014).

SUMMARY OF THE INVENTION

When the identification mark is automatically read, the position from which the identification mark is read is also settled in advance because the position of the identification mark is also the same on the workpiece of the same lot. However, actually the orientation and the position with and to which the workpiece is conveyed deviate every time. Therefore, there is the following problem. When the identification mark deviates from the position settled in advance, possibly the identification mark cannot be detected, an error occurs, and the treatment stops, or reading operation needs to be executed many times until the identification mark can be detected while the reading position is changed. Thus, the productivity is low. The size of the identification mark has been small in recent years particularly, and there has been a problem that it is difficult to detect the identification mark when the workpiece deviates.

Thus, an object of the present invention is to provide a treatment method of a workpiece in which an identification mark displayed on a workpiece can be efficiently read.

In accordance with an aspect of the present invention, there is provided a treatment method of a workpiece in which the workpiece on which an identification mark to identify the workpiece is displayed is treated in a treatment apparatus including a holding table that holds the workpiece, an imaging unit that images the workpiece held by the holding table, and a treatment unit that treats the workpiece held by the holding table. The treatment method of a workpiece includes a positional relation storing step of storing a position relation between a reference point of the workpiece and the identification mark, a holding step of holding the workpiece on the holding table, and a reference point detection step of imaging the workpiece held by the holding table by the imaging unit and detecting the reference point. The treatment method of a workpiece includes also a reading step of detecting the identification mark on the basis of the positional relation recorded in the positional relation storing step and imaging the identification mark by the imaging unit to read the identification mark, a treatment step of treating the workpiece, and an information recording step of associating information regarding the workpiece indicated by the identification mark read in the reading step with treatment information relating to the treatment step and recording the information regarding the workpiece and the treatment information.

Preferably, the reference point is the center of the workpiece.

In the present invention, the positional relation between the reference point of the workpiece and the identification mark is stored in the positional relation storing step before treatment of the workpiece. Then, the reference point that is easier to detect than the identification mark is first detected in the reference point detection step, and the identification mark is detected by using the positional relation on the basis of the reference point. Therefore, the identification mark can be efficiently read in a short time even when the position or orientation of the workpiece deviates. Further, in the present invention, by using the center of the workpiece as the reference point of the workpiece, the reference point can be detected in exactly the same manner even when the orientation or position of the workpiece deviates, and thus the identification mark can be efficiently read in a short time without being affected by the deviation of the position or orientation of the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not limited by contents described in the following embodiment. Further, what can be easily envisaged by those skilled in the art and what are substantially the same are included in constituent elements described below. Moreover, configurations described below can be combined as appropriate. In addition, various kinds of omission, replacement, or change of a configuration can be carried out without departing from the gist of the present invention.

Figure 1:
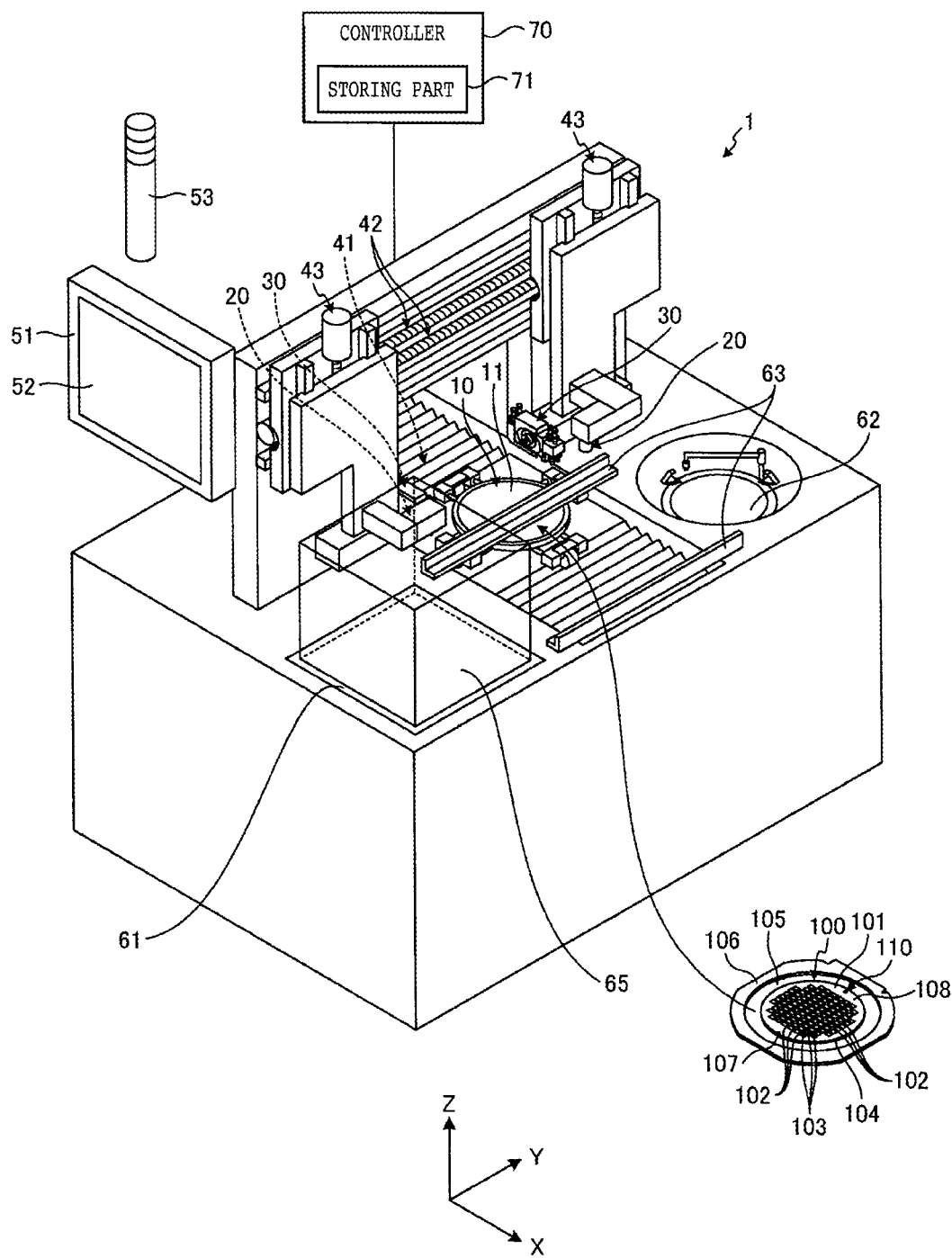
FIG. 1 is a perspective view illustrating a configuration example of a treatment apparatus that executes a treatment method of a workpiece according to an embodiment.

A treatment method of a workpiece according to the embodiment of the present invention will be described on the basis of drawings. FIG. 1 is a perspective view illustrating a configuration example of a treatment apparatus 1 that executes the treatment method of a workpiece according to the embodiment. As illustrated in FIG. 1, the treatment apparatus 1 includes a holding table 10, imaging units 20, treatment units 30, an X-axis direction movement unit 41, Y-axis direction movement units 42, Z-axis direction movement units 43, a display unit 51, an input unit 52, an informing unit 53, a cassette placement pedestal 61, a cleaning unit 62, a pair of rails 63, and a controller 70.

Figure 2:
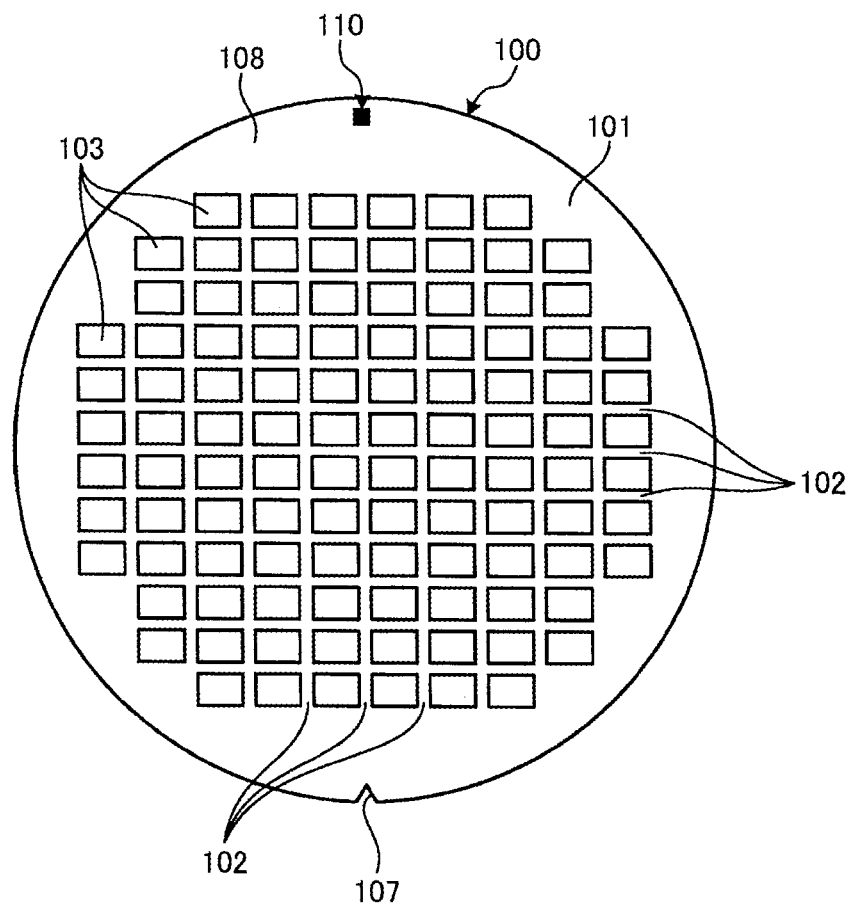
FIG. 2 is a top view illustrating one example of a workpiece that is a treatment target of the treatment method of a workpiece according to the embodiment.

FIG. 2 is a top view illustrating one example of a workpiece 100 that is a treatment target of the treatment method of a workpiece according to the embodiment. As illustrated in FIG. 2, the workpiece 100 is a circular plate-shaped semiconductor wafer, an optical device wafer, or the like that contains silicon, sapphire, silicon carbide (SiC), gallium arsenide, glass, or the like as a main material, for example. In the workpiece 100, as illustrated in FIG. 2, devices 103 with a chip size are formed in regions marked out by multiple planned dividing lines 102 formed in a lattice manner in a flat front surface 101. In the present embodiment, for the workpiece 100, as illustrated in FIG. 1, an adhesive tape 105 is stuck to a back surface 104 on the back side of the front surface 101, and an annular frame 106 is mounted on an outer edge part of the adhesive tape 105. However, the workpiece 100 is not limited thereto in the present invention. Furthermore, in the workpiece 100, a notch 107 that is a mark indicating the crystal orientation of the workpiece 100 is formed at the outer edge as illustrated in FIG. 1 and FIG. 2. However, the workpiece 100 is not limited thereto in the present invention. An orientation flat that is a mark similarly indicating the crystal orientation of the workpiece 100 may be formed instead of the notch 107, or the notch 107 or the orientation flat does not need to be formed. Moreover, the workpiece 100 may be a rectangular package substrate having multiple devices sealed by a resin, a ceramic plate, a glass plate, or the like in the present invention.

For the workpiece 100, as illustrated in FIG. 2, an identification mark 110 indicting a workpiece ID that is individually given to the workpiece 100 and allows identification of the workpiece 100 is displayed in an outer circumferential surplus region 108 in which the device 103 is not formed in the front surface 101 of the workpiece 100. In the present embodiment, the outer diameter of the workpiece 100 is 200 mm (8 inches), 300 mm (12 inches), or the like, for example, whereas the size of the identification mark 110 is as small as at least 1 μm and at most 10 μm, for example. The position and the size of the identification mark 110 are settled for each lot of the workpiece 100.

The holding table 10 includes a circular disc-shaped frame body in which a recessed part is formed and a suction adhesion part that is fitted into the recessed part and has a circular disc shape. The suction adhesion part of the holding table 10 is formed of a porous ceramic or the like having a large number of porous holes and is connected to a vacuum suction source that is not illustrated through a vacuum suction path that is not illustrated. As illustrated in FIG. 1, the upper surface of the suction adhesion part of the holding table 10 is a holding surface 11 over which the workpiece 100 is placed and that sucks and holds the placed workpiece 100 by a negative pressure introduced from the vacuum suction source. In the present embodiment, the workpiece 100 is placed over the holding surface 11 with the front surface 101 oriented upward, and the holding surface 11 sucks and holds the placed workpiece 100 from the side of the back surface 104 with the interposition of the adhesive tape 105. The holding surface 11 and the upper surface of the frame body of the holding table 10 are disposed on the same plane and are formed in parallel to an XY-plane that is a horizontal plane.

The holding table 10 is disposed to be capable of moving in an X-axis direction parallel to a horizontal direction by the X-axis direction movement unit 41. By moving along the X-axis direction by the X-axis direction movement unit 41, the holding table 10 moves the position of the imaging unit 20 and the treatment unit 30 over the front surface 101 of the workpiece 100 held by the holding table 10 in the X-axis direction (opposite direction to the movement direction of the holding table 10). The holding table 10 is disposed to be capable of rotating around a Z-axis that is parallel to the vertical direction and is orthogonal to the XY-plane by a rotational drive source that is not illustrated.

The imaging unit 20 includes an imaging element that images the workpiece 100 held by the holding table 10. The imaging element is a charge-coupled device (CCD) imaging element or complementary MOS (CMOS) imaging element, for example. The imaging unit 20 images the front surface 101 of the workpiece 100 that is held by the holding table 10 and is before treatment by the treatment unit 30, and obtains an image for performing teaching in which a characteristic pattern that becomes a basis for detection of the planned dividing line 102 is set, and the distance from the pattern to the planned dividing line 102 is registered in the controller 70, and outputs the obtained image to the controller 70. The imaging unit 20 images the front surface 101 of the workpiece 100 that is held by the holding table 10 and is before treatment by the treatment unit 30, and obtains an image for performing alignment in which position adjustment between the workpiece 100 and the treatment unit 30 is executed, and outputs the obtained image to the controller 70. Further, the imaging unit 20 images the front surface 101 of the workpiece 100 that is held by the holding table 10 and is before treatment by the treatment unit 30, and obtains an image for performing a treatment check in which whether or not treatment to the workpiece 100 has been executed in a normal range is automatically checked, and outputs the obtained image to the controller 70. In the present embodiment, the imaging unit 20 is fixed adjacent to the treatment unit 30 and moves integrally with the treatment unit 30.

The treatment unit 30 treats the workpiece 100 held by the holding table 10. In the present embodiment, as illustrated in FIG. 1, the treatment unit 30 is a cutting unit that includes a spindle having a tip on which a cutting blade is mounted and executes cutting treatment of the workpiece 100 held by the holding table 10. In the treatment unit 30, rotational operation around the axial center parallel to one direction (Y-axis direction in FIG. 1) of the horizontal direction is applied to the cutting blade mounted on the tip of the spindle by rotational operation of the spindle. This causes the treatment unit 30 to execute the cutting treatment of the workpiece 100 held by the holding table 10 along the planned dividing line 102. As illustrated in FIG. 1, the treatment apparatus 1 is a treatment apparatus including two sets of the imaging unit 20 and the treatment unit 30 (cutting unit), that is, a two-spindle dicer, the treatment apparatus (cutting apparatus) of what is generally called a facing dual type.

The treatment units 30 are disposed to be capable of moving in the Y-axis direction that is parallel to the horizontal direction and is orthogonal to the X-axis direction by the Y-axis direction movement unit 42 and are disposed to be capable of moving in the Z-axis direction by the Z-axis direction movement unit 43. By the Y-axis direction movement unit 42 and the Z-axis direction movement unit 43, the treatment units 30 move relative to the workpiece 100 held by the holding table 10 along the Y-axis direction and the Z-axis direction, respectively.

The X-axis direction movement unit 41 moves the holding table 10 relative to the imaging unit 20 and the treatment unit 30 along the X-axis direction. The Y-axis direction movement units 42 and the Z-axis direction movement units 43 move the imaging unit 20 and the treatment unit 30 relative to the holding table 10 along the Y-axis direction and the Z-axis direction, respectively. The X-axis direction movement unit 41, the Y-axis direction movement units 42, and the Z-axis direction movement units 43 are each configure to include, for example, a well-known ball screw disposed rotatably around the axial center of the X-axis, the Y-axis, or the Z-axis, a well-known pulse motor that rotates the ball screw around the axial center, and a well-known guide rail that supports the holding table 10 or the imaging unit 20 and the treatment unit 30 movably in the X-axis direction, the Y-axis direction, or the Z-axis direction.

The X-axis direction movement unit 41, the Y-axis direction movement units 42, and the Z-axis direction movement units 43 include encoders that read the rotational position of the pulse motors, and detect the relative positions between the holding table 10 and the imaging unit 20 and the treatment unit 30 in the X-axis direction, the Y-axis direction, and the Z-axis direction on the basis of the rotational position of the pulse motors read by the encoders to output the detected relative positions to the controller 70. The X-axis direction movement unit 41, the Y-axis direction movement units 42, and the Z-axis direction movement units 43 are not limited to the configuration that detects the relative positions between the holding table 10 and the imaging unit 20 and the treatment unit 30 by the encoders, and may be configured by linear scales parallel to the X-axis direction, the Y-axis direction, and the Z-axis direction, respectively, and reading heads that are disposed to be capable of moving in the X-axis direction, the Y-axis direction, and the Z-axis direction, respectively, by the X-axis direction movement unit 41, the Y-axis direction movement units 42, and the Z-axis direction movement units 43 and read the linear scales.

The display unit 51 is disposed on a cover that is not illustrated in the treatment apparatus 1 with the display surface side oriented outward. The display unit 51 displays a screen of setting of treatment conditions of the treatment apparatus 1, imaging conditions of the imaging unit 20, and various conditions of teaching, alignment, a treatment check, and so forth, an image that is captured by the imaging unit 20 and is for executing teaching, alignment, or a treatment check, a check result by a treatment check, and so forth in such a manner that they can be visually recognized by the operator. The display unit 51 is configured by a liquid crystal display device or the like. On the display unit 51, the input unit 52 used when the operator inputs information relating to the above-described various conditions of the treatment apparatus 1, information relating to display of an image, or the like is disposed. The input unit 52 disposed on the display unit 51 is configured by at least one of a touch panel disposed on the display unit 51, a keyboard, and so forth. The display unit 51 does not need to be fixed to the treatment apparatus 1. The display unit 51 may be included in optional communication equipment, and the optional communication equipment may be connected to the treatment apparatus 1 in a wireless or wired manner.

The informing unit 53 is disposed on the upper side of the cover that is not illustrated in the treatment apparatus 1. In the present embodiment, the informing unit 53 is a light emitting unit configured by a light emitting diode or the like and informs an error that has occurred in imaging by the imaging unit 20 or in treatment by the treatment unit 30, a check result by a treatment check, and so forth in such a manner that the operator can recognize the informing by lighting, blinking, the color of light, and so forth of the light emitting unit. The informing unit 53 is not limited to the light emitting unit in the present invention, and may be a sound unit that is configured by a speaker or the like and issues sound and inform an error that has occurred, a check result by a treatment check, and so forth in such a manner that the operator can recognize the informing by sound of the sound unit.

The cassette placement pedestal 61 is a placement pedestal on which a cassette 65 that is a container for housing multiple workpieces 100 is placed, and raises and lowers the placed cassette 65 in the Z-axis direction. The cleaning unit 62 cleans the workpiece 100 after treatment and removes foreign matter such as treatment dust adhering to the workpiece 100. The treatment apparatus 1 further includes a conveying unit that is not illustrated and the conveying unit that is not illustrated conveys the workpiece 100 among the holding table 10, the cleaning unit 62, the pair of rails 63, and the cassette 65.

The controller 70 controls operation of the respective constituent elements of the treatment apparatus 1 and causes the treatment apparatus 1 to execute various kinds of treatment for the workpiece 100 including the treatment method of a workpiece according to the embodiment. The controller 70 includes a storing part 71. The storing part 71 stores an image that is captured by the imaging unit 20 and is for performing teaching, alignment, a treatment check, or the like, a characteristic pattern (target), information regarding XY-coordinates that represent a positional relation 130 between a reference point 120 of the workpiece 100 and the identification mark 110, information regarding XY-coordinates that represent the distance and the direction from the target to the planned dividing line 102, information regarding the workpiece 100 indicated by the identification mark 110, treatment information relating to treatment of the workpiece 100, and so forth.

The information regarding the workpiece 100 is specifically a lot number given to the same kind of workpiece 100 in common and a workpiece ID indicating individual identification information set for each workpiece 100. The treatment information relating to treatment of the workpiece 100 includes treatment conditions that are set in advance before the workpiece 100 is treated and to which a reference is made when the workpiece 100 is treated and treatment data detected by optional detectors and so forth disposed for the respective constituent elements of the treatment apparatus 1 in and after treatment of the workpiece 100.

The treatment conditions are the kind of treatment unit 30, the kind of treatment tool mounted in the treatment unit 30, operation conditions of the treatment tool, and so forth. The kind of treatment unit 30 is the cutting unit in the present embodiment. The treatment tool is a cutting blade in the present embodiment, in which the treatment unit 30 is the cutting unit. The operation conditions of the treatment tool are the rotation speed of the spindle to which the cutting blade is fixed and so forth in the present embodiment, in which the treatment unit 30 is the cutting unit.

In the present embodiment, in which the treatment unit 30 is the cutting unit, the treatment data are measurement data in treatment of the workpiece 100, such as the vibration of a mount that fixes the cutting blade to the tip of the spindle and the holding table 10 that holds the workpiece 100, the current and voltage of motors that drive the spindle and the holding table 10, the torque generated at the time of rotation or movement of the spindle and the holding table 10, the load applied to the holding table 10 in the Z-axis direction, the processing feed rate that is the relative movement speed of the treatment unit 30 with respect to the holding table 10, the supply pressure, temperature, and flow rate of cutting water, and the thickness of the workpiece 100, images before and after the treatment taken by the imaging unit 20, information regarding a mark generated in association with the treatment, such as the width and position of a treatment mark, chipping, and adhesion of foreign matter measured by image processing from the image after the treatment, change in the image detected through comparison between the images before and after the treatment, and so forth.

The controller 70 includes a computer system in the present embodiment. The computer system included in the controller 70 has a calculation processing device having a microprocessor like a central processing unit (CPU), a storing device having a memory like a read only memory (ROM) or a random access memory (RAM), and an input-output interface device. The calculation processing device of the controller 70 executes calculation processing in accordance with a computer program stored in the storing device of the controller 70 and outputs a control signal for controlling the treatment apparatus 1 to the respective constituent elements of the treatment apparatus 1 through the input-output interface device of the controller 70. Functions of the storing part 71 are implemented by the storing device of the controller 70 in the present embodiment.

Figure 3:
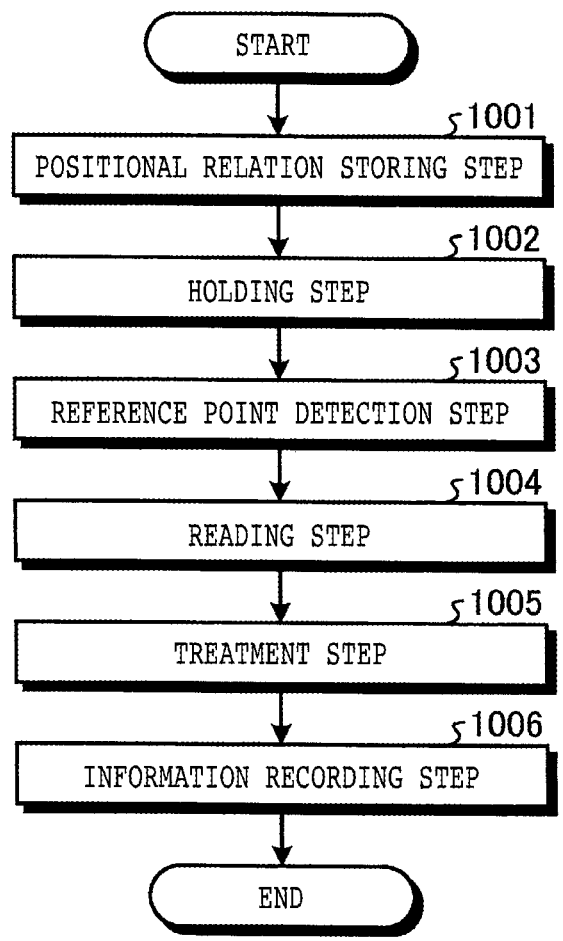
FIG. 3 is a flowchart illustrating the treatment procedure of the treatment method of a workpiece according to the embodiment.

FIG. 3 is a flowchart illustrating the treatment procedure of the treatment method of a workpiece according to the embodiment. The treatment method of a workpiece according to the embodiment is one example of operation processing executed by the treatment apparatus 1 and includes a positional relation storing step 1001, a holding step 1002, a reference point detection step 1003, a reading step 1004, a treatment step 1005, and an information recording step 1006 as illustrated in FIG. 3.

Figure 4:
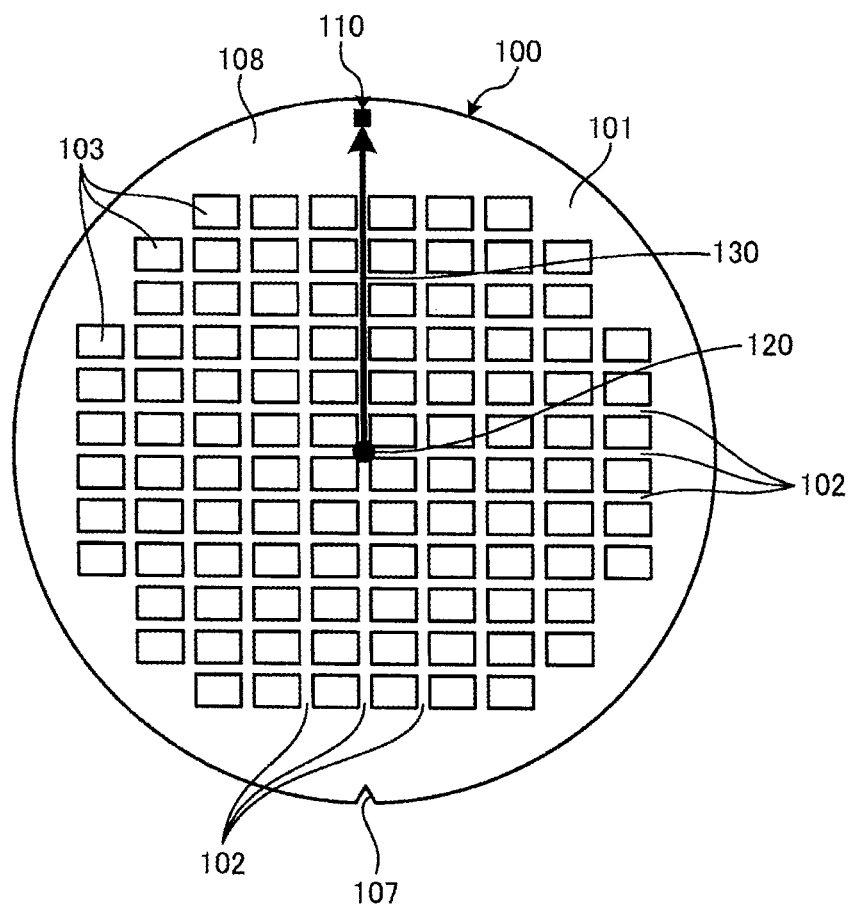
FIG. 4 is a top view for explaining a positional relation storing step in FIG. 3.
Figure 5:
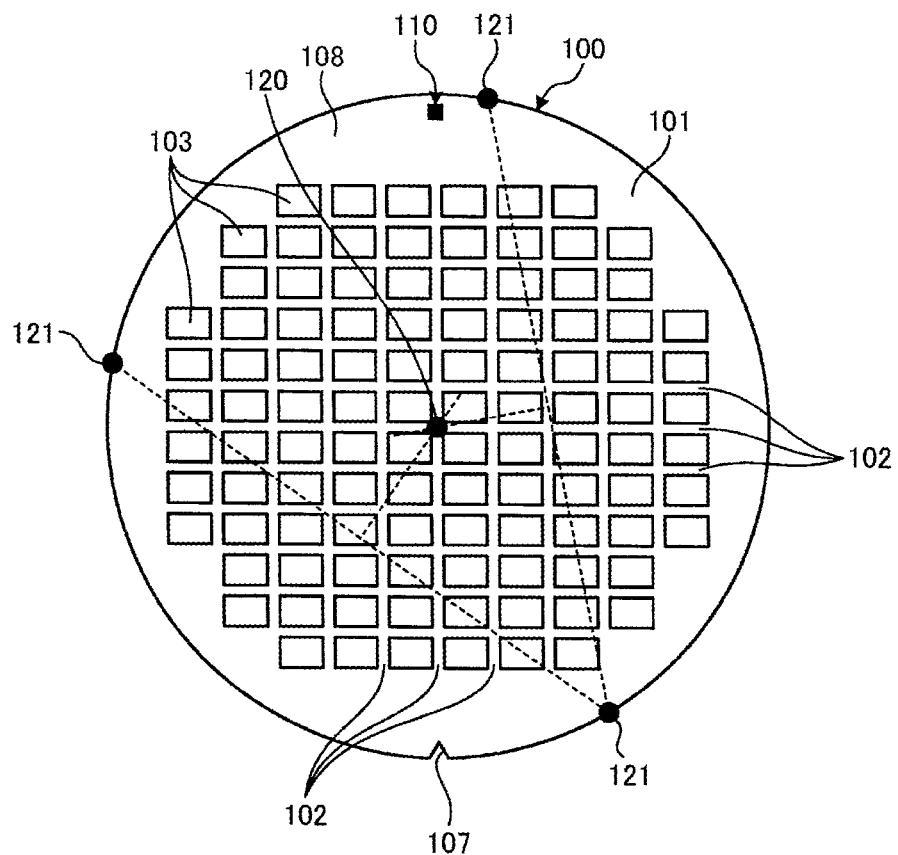
FIG. 5 is a top view for explaining the positional relation storing step and a reference point detection step in FIG. 3.

FIG. 4 is a top view for explaining the positional relation storing step 1001 in FIG. 3. FIG. 5 is a top view for explaining the positional relation storing step 1001 and the reference point detection step 1003 in FIG. 3. The positional relation storing step 1001 is a step of storing the positional relation 130 between the reference point 120 of the workpiece 100 and the identification mark 110 as illustrated in FIG. 4. In the present embodiment, the positional relation storing step 1001 is executed regarding the first workpiece 100 of a lot to be treated by the treatment apparatus 1.

As the reference point 120 of the workpiece 100, a point whose position is easy to identify compared with the identification mark 110, that is, a point that is easier to detect even when the orientation or position of the workpiece 100 deviates, is preferable, and it is particularly preferable to employ the center of the workpiece 100 as in the present embodiment. The center of the workpiece 100 can be detected as long as three points at the outer edge of the workpiece 100 are detected wherever the three points are located, and the possibility that the outer edge of the workpiece 100 falls within the field of view of the imaging unit 20 is high even when the workpiece 100 somewhat deviates. Thus, the center of the workpiece 100 can be easily detected. Although the reference point 120 of the workpiece 100 is the center of the workpiece 100 in the present embodiment, the reference point 120 is not limited thereto in the present embodiment and may be any position that is easy to detect by the imaging unit 20 compared with the identification mark 110 on the front surface 101 of the workpiece 100.

In the positional relation storing step 1001, first, the controller 70 conveys the first workpiece 100 of a lot to be treated by the treatment apparatus 1 onto the holding table 10 by the conveying unit that is not illustrated, and causes the workpiece 100 to be held by the holding table 10. In the positional relation storing step 1001, next, the controller 70 detects the coordinates of the center of the workpiece 100 held by the holding table 10 as the coordinates of the reference point 120. Specifically, as illustrated in FIG. 5, the controller 70 images three points of an outer edge 121 of the workpiece 100 held by the holding table 10 by the imaging unit 20 and calculates the coordinates of the three points of the outer edge 121 by image processing. Then, the controller 70 calculates two perpendicular bisectors of line segments that link optional two points and detects the coordinates of the intersection of the two perpendicular bisectors as the coordinates of the center of the workpiece 100.

In the positional relation storing step 1001, after the reference point 120 of the workpiece 100 is detected, the controller 70 aligns the imaging unit 20 with the reference point 120 of the workpiece 100 and executes adjustment through rotating the holding table 10 to cause one of two planned dividing lines 102 intersecting each other in the imaging region of the imaging unit 20 to become parallel to the X-axis direction. From this state, the controller 70 moves the imaging unit 20 to a position at which the identification mark 110 appears at the center of the imaging region, and stores, by the storing part 71, the distance and the direction from the reference point 120 of the workpiece 100 to the identification mark 110 as XY-coordinates. These XY-coordinates represent the positional relation 130 between the reference point 120 of the workpiece 100 and the identification mark 110 in the present embodiment.

Further, the positional relation storing step 1001 may be executed together with teaching (teaching step) in which the position of the planned dividing line 102 is registered in the storing part 71 of the controller 70 in such a manner as to be connected to the start or end of the teaching. In the teaching step, specifically, first, the controller 70 causes the imaging unit 20 to capture an image including a characteristic pattern that becomes a basis for detection of the planned dividing line 102 in a state in which the workpiece 100 is held over the holding table 10, and registers the pattern as a target. In the teaching step, next, the controller 70 aligns the imaging unit 20 with the registered target (relevant pattern) and executes adjustment through rotating the holding table 10 to cause one of two planned dividing lines 102 intersecting each other in the imaging region of the imaging unit 20 to become parallel to the X-axis direction. From this state, the controller 70 moves the imaging unit 20 to a position at which the planned dividing line 102 appears at the center of the imaging region, and stores, by the storing part 71, the distance and the direction from the registered target to the planned dividing line 102 as XY-coordinates. The controller 70 automatically performs alignment in which position adjustment between the workpiece 100 and the treatment unit 30 is executed by using the XY-coordinates of the distance and the direction from the target to the planned dividing line 102 that the storing part 71 is caused to store in the teaching step. Regarding the order of the positional relation storing step 1001 and the teaching step, either of them may be executed first.

In the present invention, the positional relation storing step 1001 is not limited to the form in which the positional relation 130 between the reference point 120 of the workpiece 100 and the identification mark 110 is obtained on the treatment apparatus 1. The positional relation 130 may be obtained on another apparatus having a holding table and an imaging unit similar to those of the treatment apparatus 1, or the positional relation 130 may be obtained from a design drawing of the workpiece 100. In the positional relation storing step 1001, in a case of obtaining the positional relation 130 in a form other than the form in which it is obtained on the treatment apparatus 1, an operator inputs the XY-coordinates indicating the positional relation 130 from the input unit 52 and the storing part 71 of the controller 70 stores the XY-coordinates for which the input is accepted as the positional relation 130.

In the present embodiment, after the positional relation storing step 1001 is executed about the first workpiece 100 of the lot to be treated by the treatment apparatus 1, the holding step 1002, the reference point detection step 1003, the reading step 1004, the treatment step 1005, and the information recording step 1006 are executed for each workpiece 100 regarding all workpieces 100 of the same lot to be treated by the treatment apparatus 1.

The holding step 1002 is a step of holding the workpiece 100 over the holding table 10. In the holding step 1002, the controller 70 causes the holding table 10 to hold the workpiece 100 similarly to the above-described positional relation storing step 1001.

The reference point detection step 1003 is a step of imaging the workpiece 100 held by the holding table 10 in the holding step 1002 by the imaging unit 20 and detecting the reference point 120. In the reference point detection step 1003, the center of the workpiece 100 is detected as the reference point 120 of the workpiece 100 similarly to the above-described positional relation storing step 1001.

The reading step 1004 is a step of detecting of the identification mark 110 on the basis of the positional relation 130 recorded in the positional relation storing step 1001 and imaging the identification mark 110 by the imaging unit 20 to read the identification mark 110. In the reading step 1004, the controller 70 aligns the imaging unit 20 with the reference point 120 of the workpiece 100 and executes adjustment through rotating the holding table 10 to cause one of two planned dividing lines 102 intersecting each other in the imaging region of the imaging unit 20 to become parallel to the X-axis direction similarly to the positional relation storing step 1001. From this state, the controller 70 moves the imaging unit 20 on the basis of the positional relation 130. This can easily move the imaging unit 20 to a position at which the identification mark 110 falls within the imaging region. In the reading step 1004, thereafter, the controller 70 acquires the information regarding the workpiece 100 indicated by the identification mark 110 by imaging the identification mark 110 by the imaging unit 20 and reading the identification mark 110.

Figure 6:
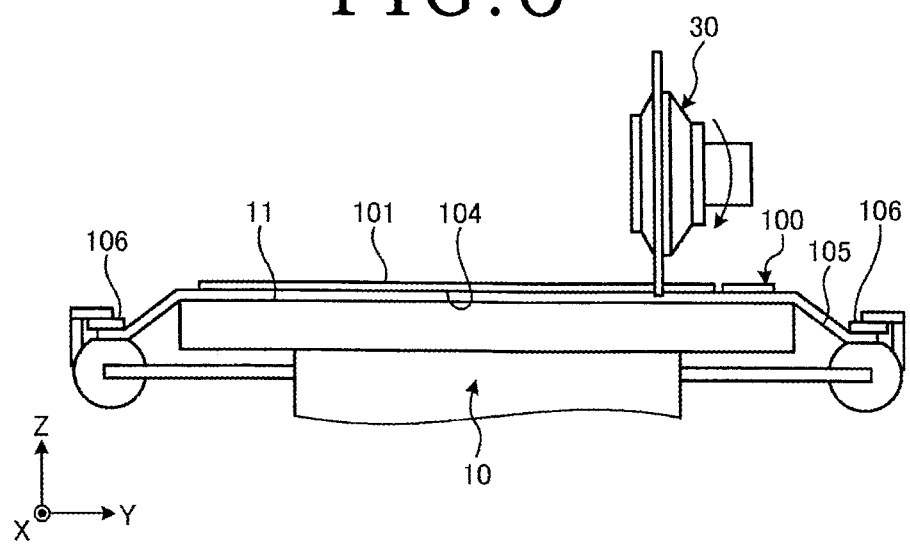
FIG. 6 is a sectional view for explaining a treatment step in FIG. 3.

FIG. 6 is a sectional view for explaining the treatment step 1005 in FIG. 3. The treatment step 1005 is a step in which the controller 70 treats the workpiece 100 by the treatment unit 30. In the present embodiment, in which the treatment unit 30 is the cutting unit, in the treatment step 1005, the controller 70 refers to the treatment conditions of the workpiece 100 stored by the storing part 71. Then, on the basis of the treatment conditions, with supply of the cutting water to the front surface 101 of the workpiece 100, the controller 70 executes cutting treatment of the workpiece 100 along the planned dividing line 102 by executing processing feed through moving the cutting blade along the planned dividing line 102 relative to the workpiece 100 held by the holding table 10 while rotating the cutting blade around the axial center by rotational operation of the spindle as illustrated in FIG. 6. In the treatment step 1005, the controller 70 acquires the treatment information relating to the treatment step 1005 in conjunction with the treatment of the workpiece 100.

In the treatment step 1005, the controller 70 acquires the treatment data relating to the treatment step 1005 in the following manner. First, the controller 70 images the front surface 101 of the workpiece 100 before the treatment by the imaging unit 20. Next, in the cutting treatment of the workpiece 100, the controller 70 detects measurement data in the treatment of the workpiece 100 by optional detectors disposed for the respective constituent elements of the treatment apparatus 1. Then, the controller 70 images a region including a treatment mark (cut groove) in the front surface 101 of the workpiece 100 after the cutting treatment by the imaging unit 20 and measures and records the width and position of the cut groove, the size and quantity of chipping, and so forth by image processing. Further, the controller 70 compares the image after the treatment with the image captured before the treatment by pattern matching or the like and detects change in the image between before and after the treatment. The controller 70 acquires the detected measurement data in the treatment of the workpiece 100 and the change in the image between before and after the treatment as the treatment data.

The information recording step 1006 is a step of associating the information regarding the workpiece 100 indicated by the identification mark 110 read in the reading step 1004 with the treatment information relating to the treatment step 1005 and recording the information regarding the workpiece 100 and the treatment information. Specifically, in the information recording step 1006, the controller 70 associates the information regarding the workpiece 100 acquired in the reading step 1004, the treatment conditions of the workpiece 100 to which the reference has been made in the treatment step 1005, and the treatment data acquired in the treatment step 1005 with each other and causes the storing part 71 to store them.

In the treatment method of a workpiece according to the embodiment having the above configuration, the positional relation 130 between the reference point 120 of the workpiece 100 and the identification mark 110 is stored in the positional relation storing step 1001 before treatment of the workpiece 100. Then, the reference point 120 that is easier to detect than the identification mark 110 is first detected in the reference point detection step 1003, and the identification mark 110 is detected by using the positional relation 130 on the basis of the reference point 120. Therefore, the treatment method provides operation and effect that the identification mark 110 can be efficiently read in a short time even when the position or orientation of the workpiece 100 deviates. In particular, the treatment method of a workpiece according to the embodiment allows the identification mark 110 to be easily detected on the basis of the reference point 120 even in a case in which the size of the identification mark 110 is as small as at least 1 µm and at most 10 µm or the like, and therefore detection thereof is liable to become difficult due to deviation of the position or orientation of the workpiece 100. Therefore, the above-described operation and effect become more remarkable.

Conventionally, it is general that, for reading an identification mark, an imaging unit for reading the identification mark is disposed on a conveyance path or the like separately from an imaging unit that images a workpiece held by a holding table. Thus, in the treatment method of a workpiece according to the embodiment, the configuration in which the identification mark 110 is read over the holding surface 11 is employed. Therefore, the imaging unit 20 used for alignment and teaching of the workpiece 100 can be used also for reading of the identification mark 110, and an increase in the cost can be suppressed. Furthermore, the imaging unit 20 used for alignment and teaching of the workpiece 100 has a high magnification to allow recognition of a pattern of the device 103 of the workpiece 100, and therefore the identification mark 110 can be read even when becoming small.

Moreover, in the treatment method of a workpiece according to the embodiment, the center of the workpiece 100 is used as the reference point 120 of the workpiece 100, and thus the reference point 120 is easily detected even when the orientation or position of the workpiece 100 deviates. Thus, the above-described operation and effect becomes more remarkable.

First and Second Modification Examples

Figure 7:
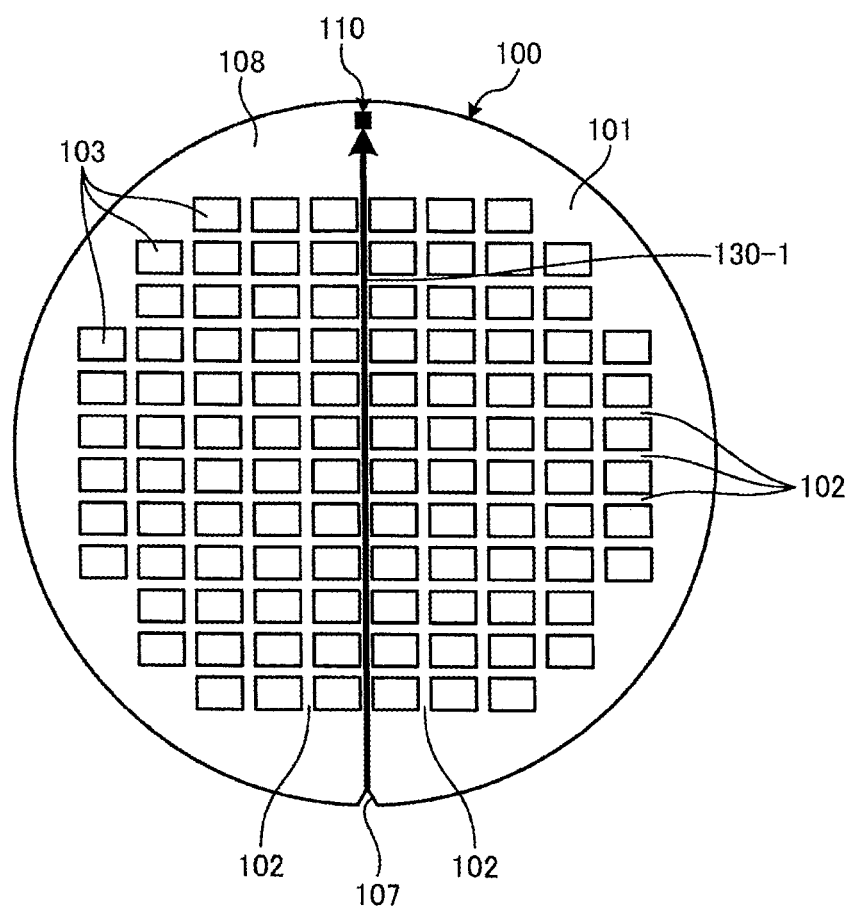
FIG. 7 is a top view for explaining the positional relation storing step in a treatment method of a workpiece according to a first modification example.
Figure 8:
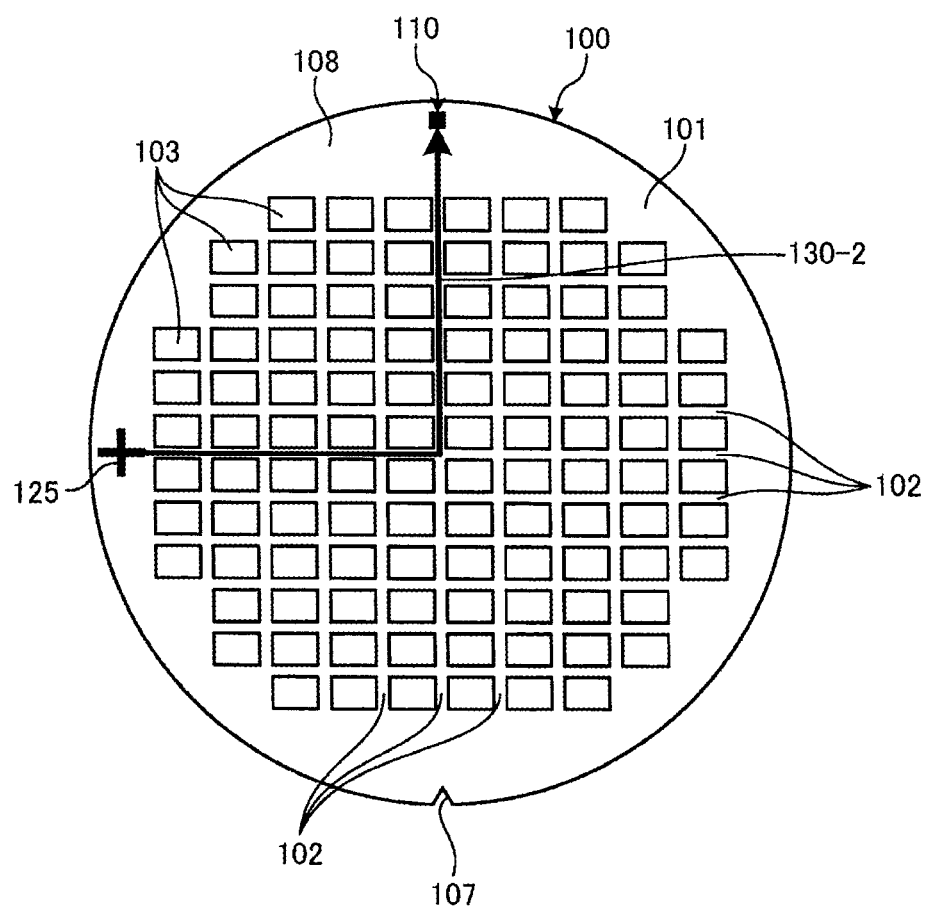
FIG. 8 is a top view for explaining the positional relation storing step in a treatment method of a workpiece according to a second modification example.

Treatment methods of a workpiece according to first and second modification examples of the present invention will be described on the basis of drawings. FIG. 7 and FIG. 8 are top views for explaining the positional relation storing step 1001 in the treatment methods of a workpiece according to the first and second modification examples, respectively. In FIG. 7 and FIG. 8, the same part as the embodiment is given the same numeral, and description thereof is omitted.

The first modification example is what is obtained by changing the reference point 120 of the workpiece 100 to the notch 107 in the above-described embodiment as illustrated in FIG. 7. In the first modification example, when only one notch 107 is formed in the workpiece 100, the notch 107 can be used as the reference point 120 of the workpiece 100. The notch 107 can be detected by moving the imaging unit 20 along the outer edge of the workpiece 100 as long as a point at the outer edge is detected wherever the point is located, and the possibility that the outer edge of the workpiece 100 falls within the field of view of the imaging unit 20 is high even when the workpiece 100 somewhat deviates. Thus, the notch 107 can be easily detected. In the positional relation storing step 1001 of the first modification example, the controller 70 causes the storing part 71 to store a positional relation 130-1 between the notch 107 and the identification mark 110.

Further, in the first modification example, the treatment target may be changed from the workpiece 100 in which the notch 107 is formed to a workpiece in which an orientation flat is formed and the reference point 120 of the workpiece 100 may be changed to the orientation flat formed in the workpiece. Also in this case, when only one orientation flat is formed in the workpiece 100, the orientation flat can be used as the reference point 120 of the workpiece 100. Also in this case, the orientation flat can be easily detected similarly to the notch 107. In the positional relation storing step 1001 in this case, the controller 70 causes the storing part 71 to store the positional relation 130-1 between the orientation flat and the identification mark 110.

The second modification example is what is obtained by changing the reference point 120 of the workpiece 100 to a characteristic pattern 125 in the above-described embodiment as illustrated in FIG. 8. In the second modification example, when only one characteristic pattern 125 is formed in the workpiece 100, the characteristic pattern 125 can be used as the reference point 120 of the workpiece 100. The characteristic pattern 125 is what is registered as a target in the teaching step, is sufficiently large compared with the identification mark 110, and therefore can be detected by the imaging unit 20 more easily than the identification mark 110. In the positional relation storing step 1001 of the second modification example, the controller 70 causes the storing part 71 to store a positional relation 130-2 between the characteristic pattern 125 and the identification mark 110.

The treatment methods of a workpiece according to the first and second modification examples are both what are obtained by changing the reference point 120 of the workpiece 100 to the notch 107, the orientation flat, or the characteristic pattern 125 that can be easily detected similarly in the treatment method of a workpiece according to the embodiment, and therefore provide operation and effect similar to those of the embodiment.

Third and Fourth Modification Examples

Figure 9:
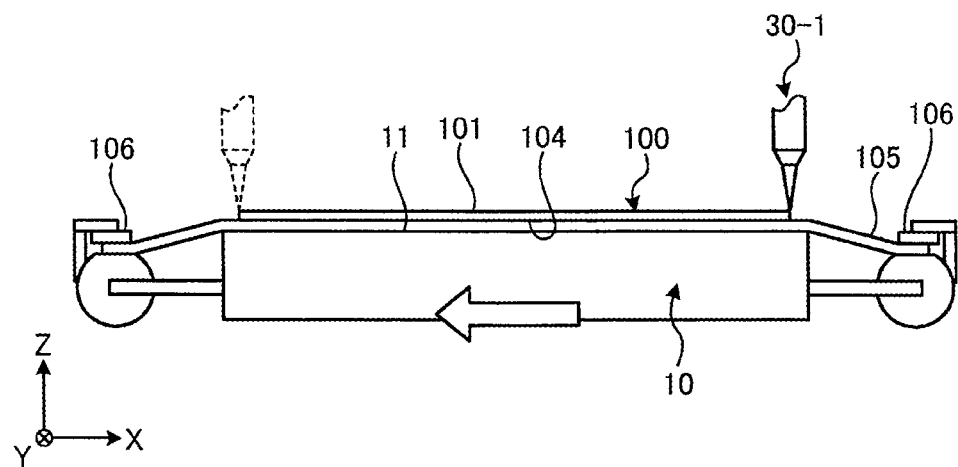
FIG. 9 is a sectional view for explaining one example of the treatment step in a treatment method of a workpiece according to a third modification example.
Figure 10:
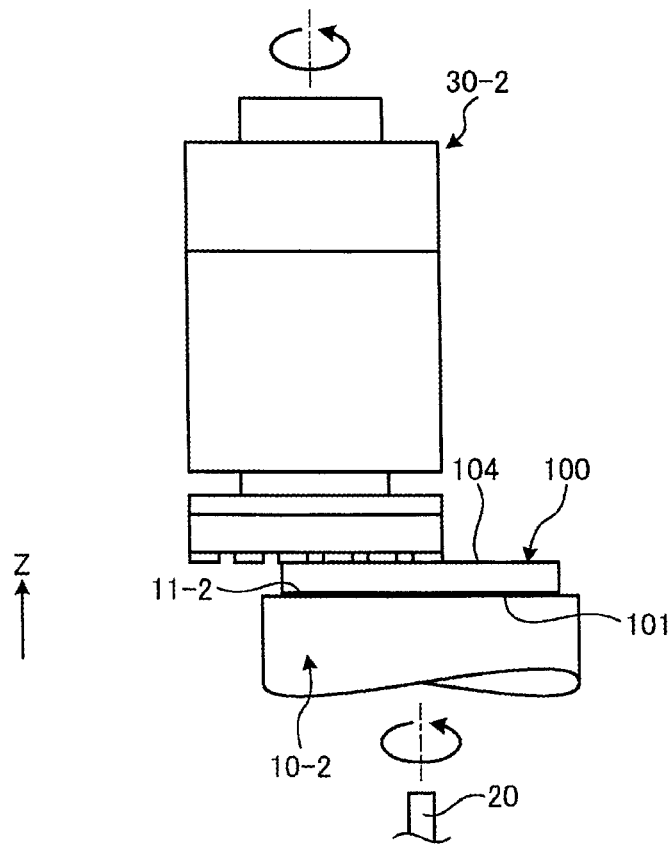
FIG. 10 is a sectional view for explaining one example of the treatment step in a treatment method of a workpiece according to a fourth modification example.

Treatment methods of a workpiece according to third and fourth modification examples of the present invention will be described on the basis of drawings. FIG. 9 and FIG. 10 are sectional views for explaining one example of the treatment step 1005 in the treatment methods of a workpiece according to the third and fourth modification examples, respectively. In FIG. 9 and FIG. 10, the same part as the embodiment is given the same numeral, and description thereof is omitted.

The third modification example is what is obtained by, in the above-described embodiment, changing the treatment unit 30 to a treatment unit 30-1 (laser beam irradiation unit) and changing the treatment of the treatment step 1005 to laser processing treatment and, in conformity thereto, changing the treatment information that is acquired and relates to the treatment step 1005 as illustrated in FIG. 9. That is, the treatment apparatus is a laser processing apparatus in the third modification example.

The treatment unit 30-1 is the laser beam irradiation unit configured to include a laser beam oscillator that generates a laser beam and a light collector that focuses the laser beam generated by the laser beam oscillator and irradiates the workpiece 100 with the laser beam. In the treatment step 1005, the controller 70 executes the laser processing treatment in which the workpiece 100 is irradiated with the laser beam and the workpiece 100 is processed by the laser beam by the treatment unit 30-1. The laser processing treatment is what is generally called ablation treatment in which irradiation with the laser beam with a wavelength having absorbability with respect to the workpiece 100 is executed to cause ablation (sublimation or evaporation) of the workpiece 100, modified layer formation treatment in which irradiation with the laser beam with a wavelength having transmissibility with respect to the workpiece 100 is executed to form a modified layer inside the workpiece 100, or the like.

In the third modification example, the treatment conditions of the treatment information that is acquired in the treatment step 1005 and relates to the treatment step 1005 are the kind of treatment unit 30-1, the kind of laser beam with which irradiation is executed by the treatment unit 30-1, irradiation conditions of the laser beam, and so forth.

The kind of treatment unit 30-1 is the laser beam irradiation unit in the third modification example. The kind of laser beam is the wavelength of the laser beam. The irradiation conditions of the laser beam include irradiation power, repetition frequency, defocus, and so forth.

In the third modification example, the treatment data of the treatment information that is acquired in the treatment step 1005 and relates to the treatment step 1005 are measurement data in treatment of the workpiece 100, such as the vibration of the light collector included in the laser beam irradiation unit, the irradiation power of the laser beam with which irradiation is actually executed, the processing feed rate that is the relative movement speed of the treatment unit 30-1 with respect to the holding table 10, and the thickness of the workpiece 100, images before and after the treatment taken by the imaging unit 20, information regarding a mark generated in association with the treatment, such as the width and position of a treatment mark, chipping, and adhesion of foreign matter measured by image processing from the image after the treatment, and change in the image detected through comparison between the images before and after the treatment.

The fourth modification example is what is obtained by making the following changes in the above-described embodiment. As illustrated in FIG. 10, the holding table 10 is changed to a holding table 10-2, and the treatment unit 30 is changed to a treatment unit 30-2 (grinding unit), and the treatment of the treatment step 1005 is changed to grinding treatment. Further, in conformity thereto, the positional relation storing step 1001, the holding step 1002, the reference point detection step 1003, and the reading step 1004 are partly changed, and the treatment information that is acquired and relates to the treatment step 1005 is changed. That is, the treatment apparatus is a grinding apparatus in the fourth modification example.

In the fourth modification example, as illustrated in FIG. 10, the workpiece 100 is placed on a holding surface 11-2 of the holding table 10-2 with the back surface 104 oriented upward, and the holding surface 11-2 sucks and holds the placed workpiece 100 from the side of the front surface 101. Furthermore, the holding table 10-2 is composed of a translucent material that allows the workpiece 100 held by the holding table 10-2 to be imaged from the side of the holding surface 11-2 by the imaging unit 20. In the fourth modification example, the imaging unit 20 is disposed under or inside the holding table 10-2 and moves relative to the holding table 10-2. The imaging unit 20 images the front surface 101 of the workpiece 100 held by the holding table 10-2 from the side of the holding surface 11-2.

In association with this, in the positional relation storing step 1001, the holding step 1002, the reference point detection step 1003, and the reading step 1004 of the fourth modification example, the following change from the above-described embodiment is made. The workpiece 100 is held by the holding table 10-2 from the side of the front surface 101 of the workpiece 100, and the front surface 101 of the workpiece 100 held by the holding table 10-2 is imaged from the side of the holding surface 11-2 by the imaging unit 20.

The treatment unit 30-2 is the grinding unit configured to include a spindle having a tip on which a grinding wheel in which grinding abrasive stones are annularly disposed is mounted. In the treatment step 1005, the controller 70 executes the grinding treatment in which the workpiece 100 held by the holding table 10-2 is ground from the side of the back surface 104 by the treatment unit 30-2.

In the fourth modification example, the treatment conditions of the treatment information that is acquired in the treatment step 1005 and relates to the treatment step 1005 are the kind of treatment unit 30-2, the kind of treatment tool mounted in the treatment unit 30-2, operation conditions of the treatment tool, and so forth. The kind of treatment unit 30-2 is the grinding unit in the fourth modification example. The treatment tool is the grinding wheel in the fourth modification example. The operation conditions of the treatment tool are the rotation speed of the spindle to which the grinding wheel is fixed and so forth in the fourth modification example, in which the treatment unit 30-2 is the grinding unit.

In the fourth modification example, the treatment data are measurement data in treatment of the workpiece 100, such as the vibration of the grinding wheel fixed to the tip of the spindle and the holding table 10-2 that holds the workpiece 100, the current and voltage of motors that drive the spindle and the holding table 10-2, the torque generated at the time of movement or rotation of the spindle and the holding table 10-2, the load applied to the holding table 10-2 in the Z-axis direction, the grinding feed rate that is the relative movement speed of the treatment unit 30-2 with respect to the holding table 10-2, the supply pressure, temperature, and flow rate of grinding water, and the thickness of the workpiece 100, images before and after the treatment taken by the imaging unit 20, information relating to scratch and chipping of the workpiece 100, the width, position, quantity, and size of a grinding mark, the surface roughness, foreign matter adhering to the workpiece 100, and so forth measured by image processing of the controller 70 on the basis of the images, change in the image before and after the treatment, and so forth.

The treatment methods of a workpiece according to the third and fourth modification examples are both what are obtained by changing the treatment of the treatment step 1005 to another kind of treatment in the treatment method of a workpiece according to the embodiment, and therefore provide operation and effect similar to those of the embodiment.

The present invention is not limited to the above-described embodiment. That is, the present invention can be carried out with various modifications without departing from the gist of the present invention. In the above-described embodiment and respective modification examples, the treatment units 30, 30-1, and 30-2 are the cutting unit that executes the cutting treatment, the laser beam irradiation unit that executes the laser processing treatment, and the grinding unit that executes the grinding treatment, respectively. However, the treatment unit is not limited thereto in the present invention and may be a plasma processing unit that executes irradiation with plasma to process the workpiece 100, a sticking unit that executes protective component installation treatment through sticking a protective component to the workpiece 100, an ultraviolet irradiation unit that includes an ultraviolet irradiator to irradiate the workpiece 100 with ultraviolet and executes ultraviolet irradiation treatment of the workpiece 100, a cleaning unit that includes a nozzle to supply a cleaning liquid, a gas for cleaning, or the like to the workpiece 100 and executes cleaning treatment of the workpiece 100, an inspection unit that inspects the workpiece 100 (for example, inspects chipping or inspects the surface roughness, or the like), or the like.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A treatment method of a workpiece in which the workpiece on which an identification mark to identify the workpiece is displayed is treated in a treatment apparatus including a holding table that holds the workpiece, an imaging unit that images the workpiece held by the holding table, and a treatment unit that treats the workpiece held by the holding table, the treatment method comprising:
- a positional relation storing step of storing a position relation between a reference point of the workpiece and the identification mark;
- a holding step of holding the workpiece on the holding table;
- a reference point detection step of imaging the workpiece held by the holding table by the imaging unit and detecting the reference point;
- a reading step of detecting the identification mark on a basis of the positional relation recorded in the positional relation storing step and imaging the identification mark by the imaging unit to read the identification mark;
- a treatment step of treating the workpiece; and
- an information recording step of associating information regarding the workpiece indicated by the identification mark read in the reading step with treatment information relating to the treatment step and recording the information regarding the workpiece and the treatment information.

2. The treatment method of a workpiece according to claim 1, wherein
the reference point is a center of the workpiece.

* * * * *